(12) United States Patent
Fujisaki et al.

(10) Patent No.: US 7,033,958 B2
(45) Date of Patent: Apr. 25, 2006

(54) SEMICONDUCTOR DEVICE AND PROCESS FOR PRODUCING THE SAME

(75) Inventors: Yoshihisa Fujisaki, Hachioji (JP); Hiroshi Ishihara, Tokyo (JP)

(73) Assignees: Hitachi, Ltd., Tokyo (JP); Tokyo Institute of Technology., Tokyo ( * ) Notice: Subject to any disclaimer, the term of this patent is extended or adjusted under 35 U.S.C. 154(b) by 3 days.

(21) Appl. No.: 10/649,613

(22) Filed: Aug. 28, 2003

(65) Prior Publication Data
US 2004/0043570 A1 Mar. 4, 2004

Related U.S. Application Data

(62) Division of application No. 09/984,632, filed on Oct. 30, 2001, now abandoned.

(30) Foreign Application Priority Data

Apr. 26, 2001 (JP) ............................. 2001-129243

(51) Int. Cl.
*H01L 21/31* (2006.01)
(52) U.S. Cl. ................... 438/775; 438/777; 438/792
(58) Field of Classification Search ............... 438/197, 438/585, 775–777, 791, 792; 118/723 IR; 427/569, 574
See application file for complete search history.

(56) References Cited

U.S. PATENT DOCUMENTS

| 5,043,224 A | | 8/1991 | Jaccodine et al. |
|---|---|---|---|
| 6,136,654 A | * | 10/2000 | Kraft et al. ................. 438/287 |
| 6,309,932 B1 | | 10/2001 | Ma et al. |
| 6,337,289 B1 | * | 1/2002 | Narwankar et al. ......... 438/776 |
| 6,348,420 B1 | * | 2/2002 | Raaijmakers et al. ....... 438/769 |
| 6,368,923 B1 | * | 4/2002 | Huang ......................... 438/275 |
| 6,399,445 B1 | * | 6/2002 | Hattangady et al. ........ 438/261 |

(Continued)

FOREIGN PATENT DOCUMENTS

JP 55-145373 4/1979

(Continued)

OTHER PUBLICATIONS

Phillip J. Caplan, Edward H. Poindexter, Bruce E. Deal and Reda R. Razouk, "ESR Centers, Interface States, and Oxide Fixed Charge in Thermally Oxidized Silicon Wafers", J. Appl. Phys. 50(9), Sep. 1979, pp. 5847-5854.

(Continued)

*Primary Examiner*—Tom Thomas
*Assistant Examiner*—N. Drew Richards
(74) *Attorney, Agent, or Firm*—Reed Smith LLP; Stanley P. Fisher, Esq.; Juan Carlos A. Marquez, Esq.

(57) ABSTRACT

A semiconductor apparatus is provided that is thermally stable in a post process and is suitable for fabricating a gate insulator having a laminated structure with various high permittivity oxides, and a process is provided for producing the same. In order to achieve a high function formation of a gate insulator, a silicon nitride film having a specific inductive capacity approximately twice as much as that of silicon oxide, and which is thermally stable, is not provided with a Si—H bond and is used as at least a portion of the gate insulator. Further, an effective thickness of a gate insulator forming a multilayered structure insulator laminated with a metal oxide having a high dielectric constant, in conversion to silicon oxide, can be thinned to less than 3 nm while restraining leakage current.

17 Claims, 9 Drawing Sheets

U.S. PATENT DOCUMENTS

| | | | |
|---|---|---|---|
| 6,610,614 B1 * | 8/2003 | Niimi et al. | 438/775 |
| 2002/0111000 A1 * | 8/2002 | Kawakami et al. | 438/584 |
| 2002/0119673 A1 * | 8/2002 | Yieh et al. | 438/758 |

FOREIGN PATENT DOCUMENTS

| | | | |
|---|---|---|---|
| JP | 58-040833 | | 9/1981 |
| JP | 58040833 A | * | 3/1983 |
| JP | 10-135207 | | 10/1997 |
| JP | 11-126902 | | 8/1998 |
| JP | 2000-269483 | | 3/1999 |
| JP | 2000269483 A | * | 9/2000 |

OTHER PUBLICATIONS

F. B. McLean, "A Framework for Understanding Radiation-Induced Interface States in $SiO_2$ MOS Structures", IEEE Transactions on Nuclear Science, vol. NS-27, No. 6, Dec. 1980, pp. 1651-1657.

* cited by examiner

SEMICONDUCTOR DEVICE AND PROCESS FOR PRODUCING THE SAME

This application is a Divisional of nonprovisional U.S. application Ser. No. 09/984,632 filed on Oct. 30, 2001 now abandoned. Priority is claimed based upon U.S. application Ser. No. 09/984,632 filed on Oct. 30, 2001, which claims the priority of Japanese Application No. 2001-129243 filed on Apr. 26, 2001.

BACKGROUND OF THE INVENTION

The present invention relates to a semiconductor device, particularly to a semiconductor device with a field effect transistor constituted by an active layer of silicon semiconductor and its integrated circuit and a process for producing the same.

Conventionally, in a field effect transistor constituted by an active layer of silicon semiconductor, an MOS (Metal Oxide Semiconductor) structure using silicon oxide as a gate insulator is used.

To meet the requirements about high grade formation for the integrated circuit and reduction of operational voltage, it is necessary to reduce the transistor's sized and operate the transistor at high speed. In order to meet the requirements the miniaturization of the transistor's size as well as thin film formation for the gate insulator are needed. Conventionally, according to a gate insulator of silicon oxide which is most generally used in an integrated circuit of silicon, it has become apparent that when a film thickness thereof is made thinner than 3 nm, there poses a problem that tunnel current starts to flow from a gate electrode to a silicon active layer, a depletion layer of the silicon active layer becomes difficult to control and an increase in power consumption results.

As a means for solving the problem, attention is attracted to silicon nitride which is provided with a value of a dielectric constant approximately twice as much as that of silicon oxide, is constituted by amorphous, provided with stably high insulating performance and does not include elements contaminating a silicon semiconductor as a gate insulator substituting for silicon oxide. However, there poses a problem that a conventional silicon nitride thin film is provided with poor heat resistance and when the silicon nitride film is subjected to a heat treatment at 550° C. or higher after forming the silicon nitride film, an energy level of trapping or emitting carriers is produced and transistor characteristics are significantly deteriorated ('P. J. Caplan, et al.: Journal of Applied Physics, 50 (1979) 5847' and 'F. B. Mclean: IEEE Transaction Nuclear Science, NS-27 (1980) 165'.

SUMMARY OF THE INVENTION

Hence, it is an object of the present invention to provide a thermally stable semiconductor device, post processing and suitable for fabricating a gate insulator having a laminated layer structure with various high dielectric constant oxides and a process of producing the same.

Conventionally, already known, proposed and used methods of forming a silicon nitride film are:
(1) a method of subjecting a silicon active layer to direct nitridation thermally by using ammonia to thereby form silicon nitride on its surface,
(2) a method of generating nitrogen plasma at a vicinity of a silicon active layer to thereby subject a silicon surface to direct nitridation and form silicon nitride,
(3) a method of forming silicon nitride on a surface of a silicon active layer by a CVD process (Chemical Vapor Deposition process) with ammonia gas and silane gas as raw materials and so on.

According to the above-described methods, it becomes apparent that a large amount of hydrogen produced by thermally decomposing ammonia is automatically added into a silicon nitride film. Further, according to the above-described method of (2), it is recognized that the silicon active layer is damaged by influence of high-speed ions and defects in crystal are caused. Dangling bonds of silicon in the silicon nitride film caused by the crystal defects operate as carrier traps and, therefore, it is necessary to inactivate the dangling bonds. In order to realize the inactivation, it is necessary to intentionally dope hydrogen and couple hydrogen to the dangling bonds of silicon.

In any of the conventional cases of forming the silicon nitride film, a large amount of hydrogen atoms are introduced as a result and the silicon nitride gate insulator which does not include hydrogen cannot be used. However, it has been reported that according to the silicon nitride film including a large amount of hydrogen, hydrogen is easily sublimated by a thermal process at 550° C. or higher, dangling bonds of silicon are produced and a trap level of carriers is formed. Therefore, conventionally, when silicon nitride is used for a gate insulator, after forming the gate insulator, it is difficult to carry out a heat treatment at high temperature of 550° C. or higher or a heat treatment in an oxidizing atmosphere.

In sum, the reason of poor heat resistance of the conventional silicon nitride film or silicon oxi-nitride film, is nothing but inclusion of a large amount of hydrogen in the film. Hence, it has been found that the poor heat resistance indicated conventionally can be overcome by using a silicon nitride film which does not include hydrogen and which does not include defects caused by damage by ions. That is, in order to subject the gate insulator to high function formation, there is used a silicon nitride film the specific inductive capacity of which is approximately twice as much as that of silicon oxide, which is thermally stable and is not provided with a Si-H bond at least as a portion of a gate insulator.

In this way, according to an aspect of the invention, there is provided a semiconductor device constituting an active layer by a single crystal or polycrystal silicon semiconductor and having a gate electrode on the active layer by interposing a gate insulator, wherein the gate insulator is formed by a silicon nitride film which does not include a chemical bond of hydrogen atoms and silicon atoms.

Further, according to another aspect of the invention, there is provided a semiconductor device which is a semiconductor device constituting an active layer by a single crystal or polycrystal silicon semiconductor and having a gate electrode on the active layer by interposing a gate insulator, wherein the gate insulating film is constituted by a multilayered structure film including at least one layer of a silicon nitride film which does not include a chemical bond of hydrogen atoms and silicon atoms.

Further, according to another aspect of the invention, there is provided a semiconductor device which is a semiconductor device constituting an active layer by a single crystal or polycrystal silicon semiconductor and having a gate electrode on the active layer by interposing a gate insulator, wherein the gate insulator is constituted by a multilayered structure film including at least one layer of a silicon nitride film which does not include a chemical bond of hydrogen atoms and silicon atoms and at least one layer of a ferroelectric thin film.

Further, according to another aspect of the invention, there is provided the semiconductor device, wherein a film other than the silicon nitride film in the multilayered structure film is constituted by a thin film comprising a polycrystal or amorphous oxide.

Further, according to another aspect of the invention, there is provided a semiconductor device which is a semiconductor device constituting an active layer by a single crystal or polycrystal silicon semiconductor and having a gate electrode on the active layer by interposing a gate insulator, wherein the gate insulator is constituted by a silicon oxi-nitride film which includes a chemical bond of oxygen atoms and silicon atoms and does not include a chemical bond of hydrogen atoms and silicon atoms.

Further, according to another aspect of the invention, there is provided a semiconductor device which is a semiconductor device constituting an active layer by a single crystal or polycrystal silicon semiconductor and having a gate electrode on the active layer by interposing a gate insulator, wherein the gate insulator is constituted by a multilayered structure film including at least one layer of a silicon oxi-nitride film which includes a chemical bond of oxygen atoms and silicon atoms and does not include a chemical bond of hydrogen atoms and silicon atoms.

Further, according to another aspect of the invention, there is provided a semiconductor device which is a semiconductor device constituting an active layer by a single crystal or polycrystal silicon semiconductor and having a gate electrode on the active layer by interposing a gate insulator, wherein the gate insulator is constituted by a multilayered structure film including at least one layer of a silicon oxi-nitride film which includes a chemical bond of oxygen atoms and silicon atoms and does not include a chemical bond of hydrogen atoms and silicon atoms and at least one layer of a ferroelectric film. Further, according to another aspect of the invention, there is provided the semiconductor apparatus, wherein a film other than the silicon oxi-nitride film in the multilayered structure film is formed by a thin film comprising a metal oxide. Further, according to another aspect of the invention, there is provided a process of producing a semiconductor device which is a process of producing a semiconductor device having a step of constituting an active layer by a single crystal or polycrystal silicon semiconductor substrate and forming a gate electrode on the active layer by interposing a gate insulator, wherein by using a nitrogen radical in a nitrogen plasma as a major active species of nitridation, the substrate is nitrided and the gate insulator is formed.

DETAILED DESCRIPTION OF THE PREFERRED EMBODIMENTS

The embodiments of the invention will be explained in reference to the following drawings:

Embodiment 1

Figure 1:
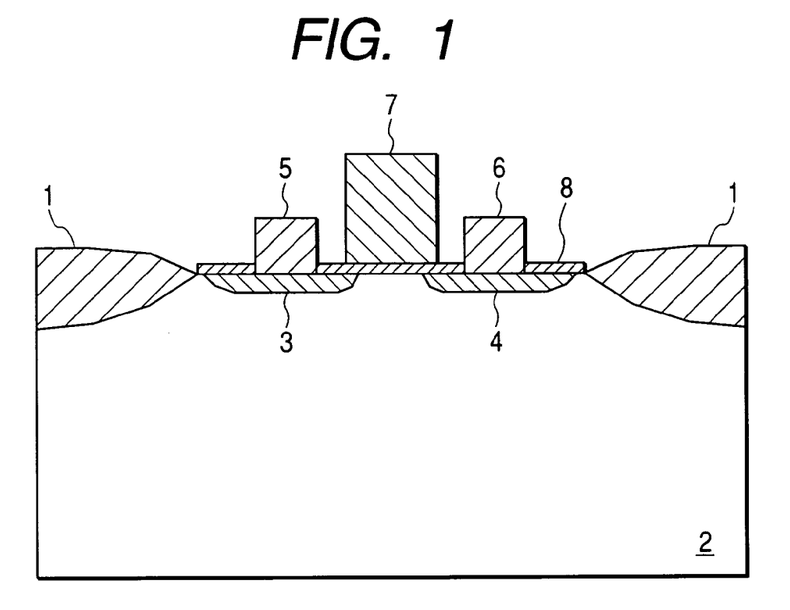
FIG. 1 is a view of a sectional structure of a field effect transistor, according to a first embodiment of the invention.

FIG. 1 shows an outline sectional view of a field effect transistor constituting an embodiment of the invention. First, field oxide 1 for isolation is provided on a single crystal silicon substrate 2 and a transistor active layer is formed. Next, in order to form a silicon nitride film constituting a gate insulator 8 at the active layer, a silicon single crystal at a surface of the active layer is subjected to direct nitridation. Further, in the drawing, numeral 3 designates an n-type impurity diffusing layer for a source electrode, numeral 4 designates an n-type impurity diffusing layer for a drain electrode, numeral 5 designates a source electrode, numeral 6 designates a drain electrode and numeral 7 designates a gate electrode.

Apparatus described below are used in a process of direct nitridation and the process is carried out by a procedure described below.

Figure 2:
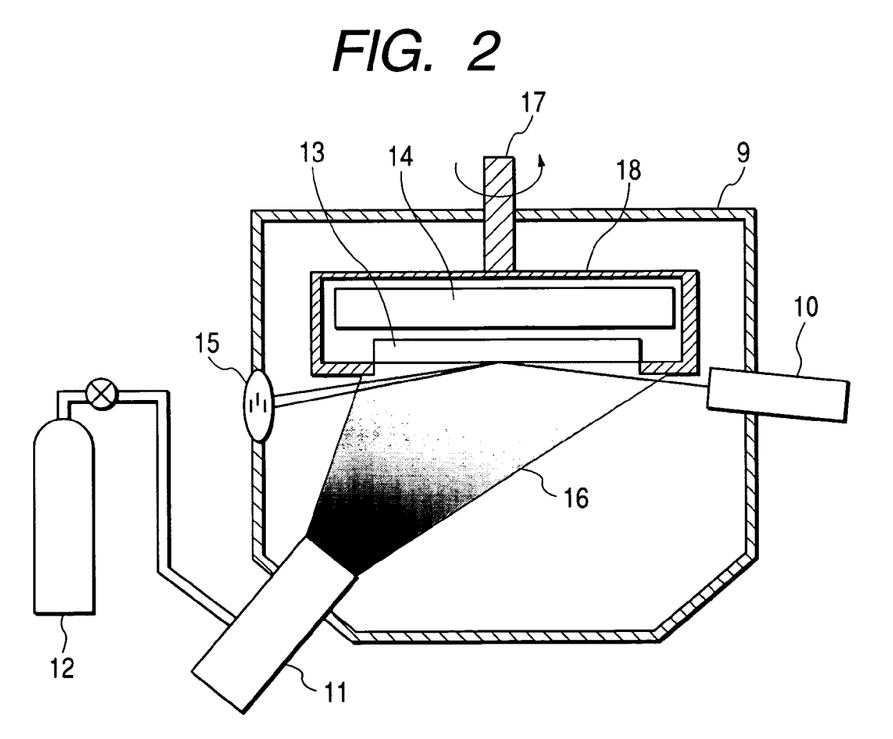
FIG. 2 is a schematic view of a radical nitriding apparatus.

FIG. 2 shows an outline view of an apparatus used for forming a silicon nitride film which does not include hydrogen and does not include carrier traps caused by defects on a silicon semiconductor. After introducing a silicon substrate 13 for forming a silicon nitride film into an ultra high vacuum vessel 9 made of stainless steel, the vacuum vessel 9 is exhausted up to $1 \times 10^{-7}$ to thereby minimize influence of moisture remaining in a nitridation process. After previously forming a diffusion layer on the silicon substrate 13, a surface thereof is cleaned by a chemical solution, thereafter subjected to a pretreatment by hydrofluoric acid diluted to 1/50 by de-ionized water to thereby remove native oxide formed on the surface of the substrate and form a hydrogen-adsorbed layer referred to as hydrogen termination and prevent the surface from being reoxidized. The vacuum vessel 9 is installed with a nitrogen radical generating apparatus (radical gun) 11 having a small plasma chamber made of PBN (Pyrolytic Boron Nitride) or made of quartz, and nitrogen radical flux 16 generated therefrom is irradiated to silicon substrate crystal to thereby subject the surface of the substrate to direct nitridation. Further, in the drawing, numeral 12 designates a high purity nitrogen tank for generating nitrogen radicals, numeral 17 designates a substrate rotating mechanism and numeral 18 designates a substrate susceptor.

Figure 3:
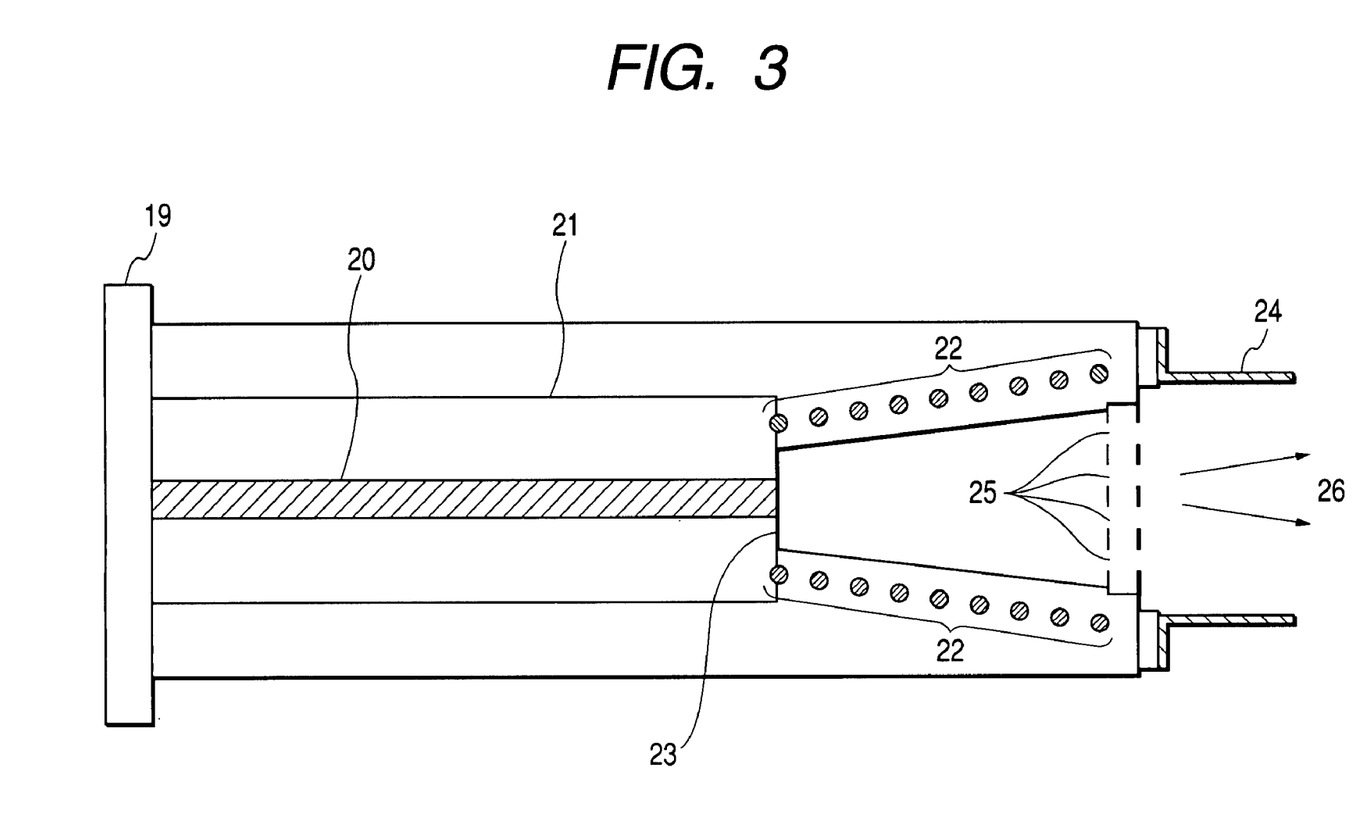
FIG. 3 is a schematic view of a nitrogen radical gun.

FIG. 3 shows a schematic view of the nitrogen radical generating apparatus. Nitrogen having a purity of 100% is made to flow to a plasma chamber 23 made of PBN or made of quartz via a nitrogen gas supply pipe 20 and RF (Radio Frequency) is applied from an outside power source to an RF induction coil 22 installed surrounding the plasma chamber to thereby generate nitrogen plasma. One side of the plasma chamber 23 communicates with the ultra high vacuum vessel of FIG. 2 via small openings 25 and nitrogen radicals generated in the plasma chamber are introduced into the ultra high vacuum vessel via the holes only by pressure difference between the plasma chamber and the ultra high vacuum vessel as nitrogen radical flux 16. The plasma does not leak into the ultra high vacuum vessel and, therefore, a probability that high-speed ions generated in the plasma reach the silicon substrate crystal and damage the silicon substrate crystal by the ions is far smaller than that of the conventional plasma nitridation process.

According to the conventional plasma nitridation process, high-speed particles (ions) damaging the Si substrate, are made to fly to the Si substrate and cause defects, however, according to the process of the present invention, contribution of the ions can almost be disregarded. According to nitridation using the nitrogen radicals, excitation energy of the radicals in a chemically high excited state, is used in a reaction, kinetic energy thereof is sufficiently small and therefore, the Si substrate is not damaged. Therefore, an $Si_3N_4$/Si interface having few defects can be realized and therefore, it is not necessary to use the conventional technology of inactivating the defects by Si—H bond and an MIS (Metal Insulator Semiconductor) structure which is thermally stable and having high quality can be realized.

Further, as shown by FIG. 3, on outer sides of the openings, two sheets of parallel plate electrodes 24 are installed as ion deflecting electrodes and by applying DC voltage therebetween, leaked ions are deflected and restined from reaching the silicon substrate.

Further, in FIG. 3, numeral 19 designates a flange made of stainless steal serving also as a radical gun base seat and numeral 21 designates a mechanism of holding the plasma chamber.

Figure 4:
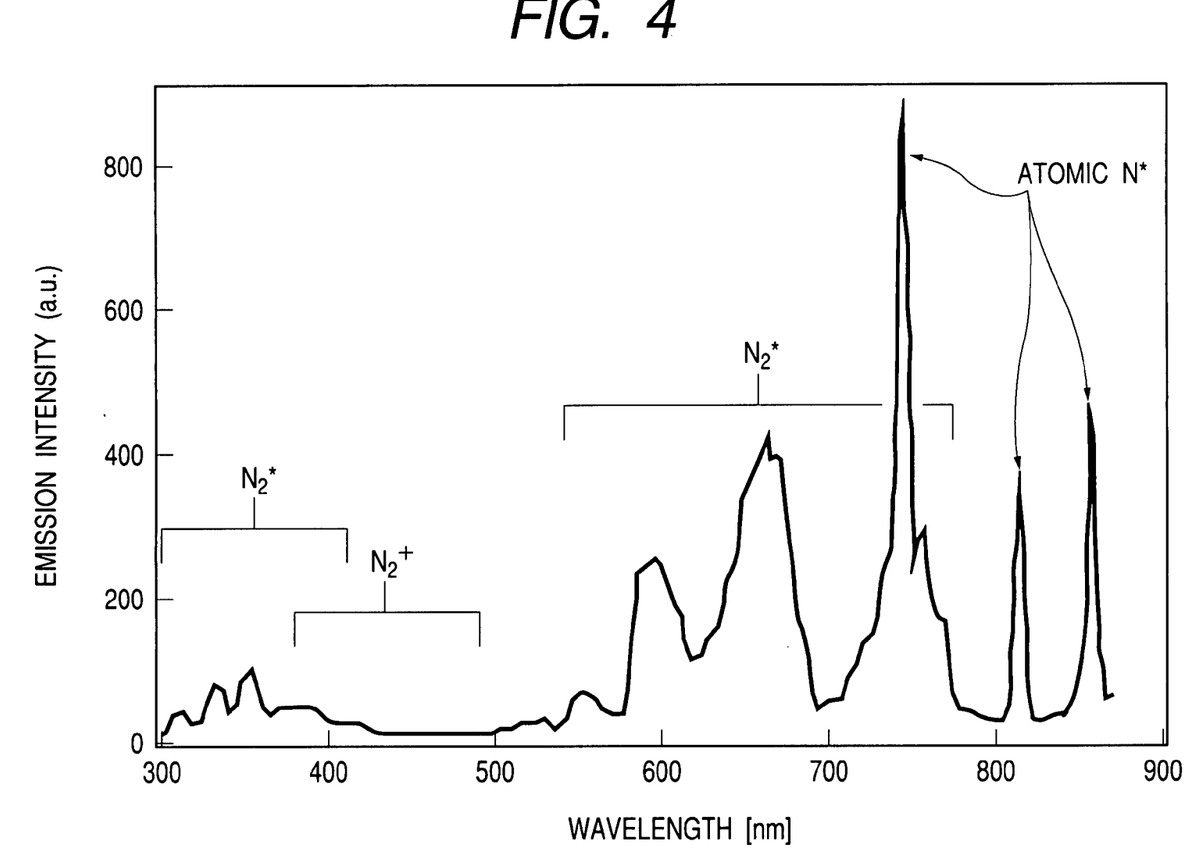
FIG. 4 is a diagram showing a spectrum of radical emission from the nitrogen radical gun.

FIG. 4 shows a spectrum of plasma emission in the plasma chamber made of PBN or made of quartz. It is known from the spectrum that emission in correspondence with $N_2^+$ ion is at an almost negligible level and strong emission in correspondence with atomic nitrogen radical (N*) and emission in correspondence with N2 radical ($N_2$*) constitute major active species. By irradiating the radicals (N*, $N_2$*) to the silicon substrate crystal as shown by FIG. 1, a silicon nitride film is formed.

Figure 5:
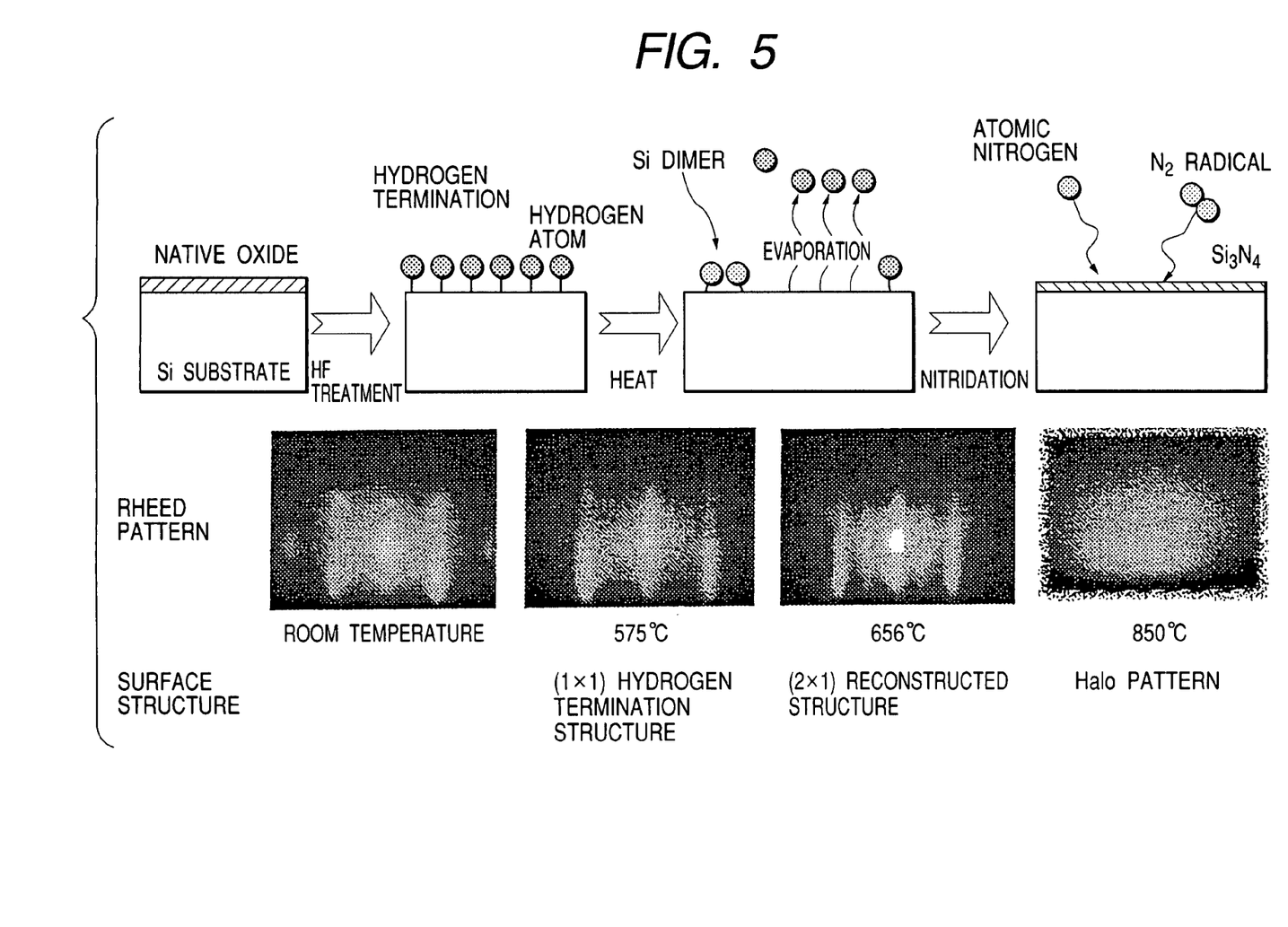
FIG. 5 is a view showing a change in an atomic arrangement at the surface of a substrate in a nitriding process.

FIG. 5 shows states of the surface of the crystal of the silicon substrate in the nitridation process. Native oxide produced at the surface of the Si substrate is removed by hydrofluoric acid (HF) and at the same time, dangling bonds appearing at the Si surface are subjected to hydrogen termination. Thereby, the Si substrate can be prevented from being reoxidized. When the Si substrate subjected to the hydrogen termination is heated, at 560° C. or higher, hydrogen atoms at the surface are evaporated and the silicon nitride film which does not include Si—H bonds is formed.

By observing a diffraction image of an electron beam impacted from an electron gun 10 for RHEED (Reflection of High Energy Electron Diffraction) observation shown in the nitridation processing apparatus of FIG. 2 to the surface of the silicon substrate 13 by a screen 15, an atomic arrangement structure at the surface of the substrate in the nitridation process is observed.

When the substrate crystal is initially introduced into the ultrahigh vacuum vessel, 1×1 RHEED pattern in correspondence with the hydrogen termination appears on the surface and it is known that native oxide does not exist on the surface. Next, when substrate temperature is elevated by a substrate heater 14 installed in the vacuum vessel shown in FIG. 2 to 560° C. or higher, the period of the RHEED pattern is changed to double to 2×1 and it is known that hydrogen at the surface is evaporated and the structure of atoms at the surface of silicon are reconstructed.

Thereafter, when the nitrogen radicals are irradiated, the RHEED pattern is made to change to a halo pattern indicating formation of an amorphous layer, which indicates that the silicon nitride film is formed. It is known from the above-described process that almost all of components related to the nitridation are electrically neutral nitrogen radicals and there is hardly a possibility that hydrogen or ions are caught by the silicon nitride film.

Further, although the RHEED observation shown in FIG. 5 is carried out at a diffusion layer area which is not provided with a pattern at the same substrate since the RHEED observation is difficult at the surface of the substrate crystal having a finely fabricated pattern, the diffusion layer area is naturally brought into a state substantially the same as that of the active layer of the transistor.

In this way, the silicon nitride film constituting the gate insulator is produced on the active layer of the transistor, thereafter, the source and the drain areas are formed by a procedure the same as that in producing a normal MOS transistor, thereafter, the gate electrode, the source electrode, the drain electrode and so on are formed to thereby produce the field effect transistor as shown by FIG. 1.

Embodiment 2

Figure 6:
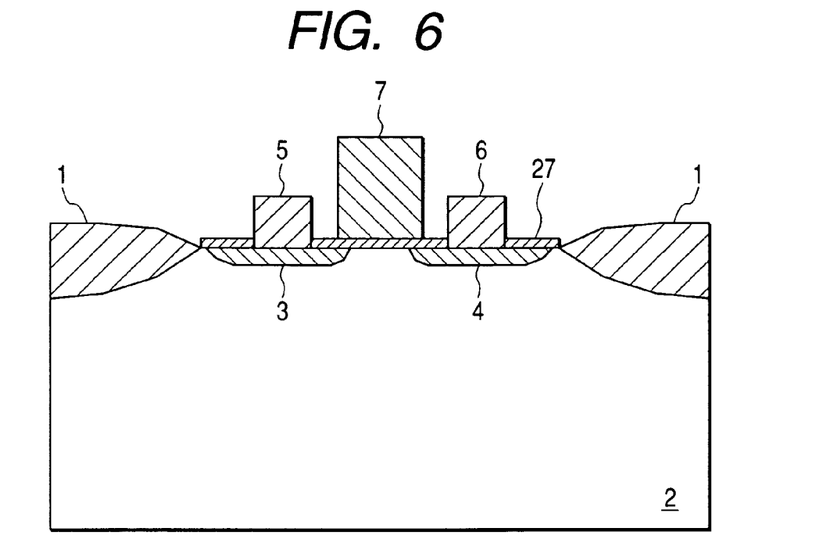
FIG. 6 is a view showing a sectional structure of a field effect transistor according to a second embodiment of the invention.

FIG. 6 shows a second embodiment according to the invention. Similar to Embodiment 1, after forming the active layer of the transistor, a silicon nitride film having a film thickness of about 1.8 nm is formed on the active layer by a procedure the same as that of Embodiment 1. Thereafter, by subjecting the silicon substrate to an oxidizing heat treatment in an oxygen atmosphere, the formed silicon nitride film is oxidized to thereby constitute a silicon oxi-nitride film. In the drawing, numeral 27 designates a gate insulator comprising the silicon oxi-nitride film produced by oxidizing the radical silicon nitride film in this way.

Figure 7:
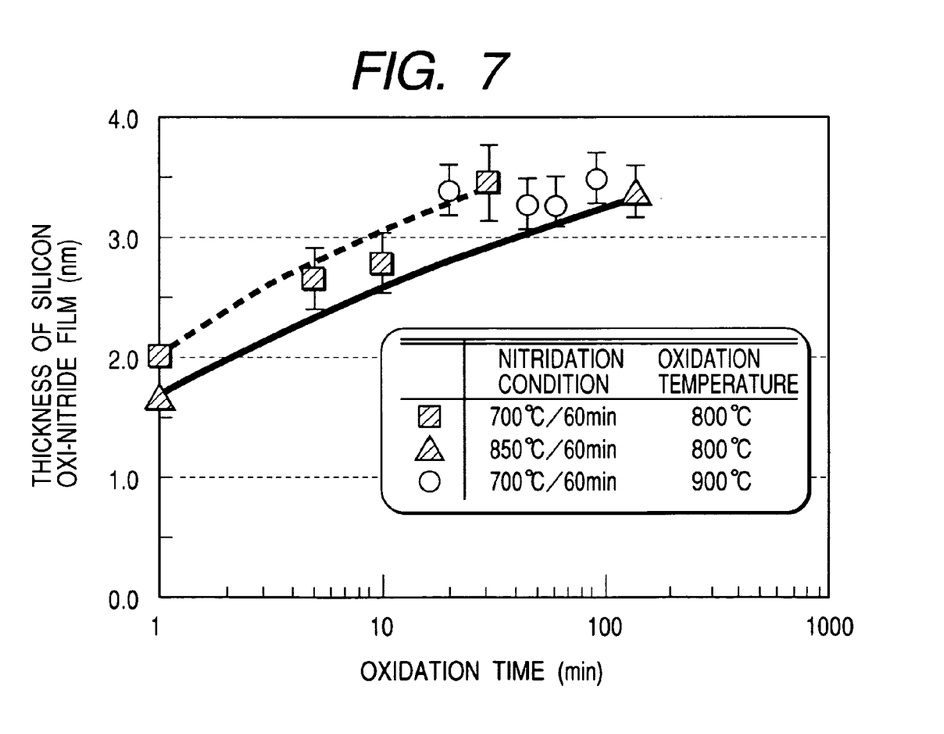
FIG. 7 is a diagram showing an oxidation resistance characteristic of a radical silicon nitride film.

FIG. 7 shows an oxidation characteristic of the silicon nitride film formed by the nitrogen radicals. In the drawing, the ordinate designates a film thickness of the silicon oxi-nitride film provided as a result of being oxidized. Different from the silicon nitride film produced by the conventional process, the silicon nitride film is not oxidized thickly even by oxidation at about 900° C. for 100 minutes and the sufficiently thin silicon oxi-nitride film can be formed. Thereafter, a field effect transistor is produced by steps the same as those in Embodiment 1.

Embodiment 3

Figure 8:
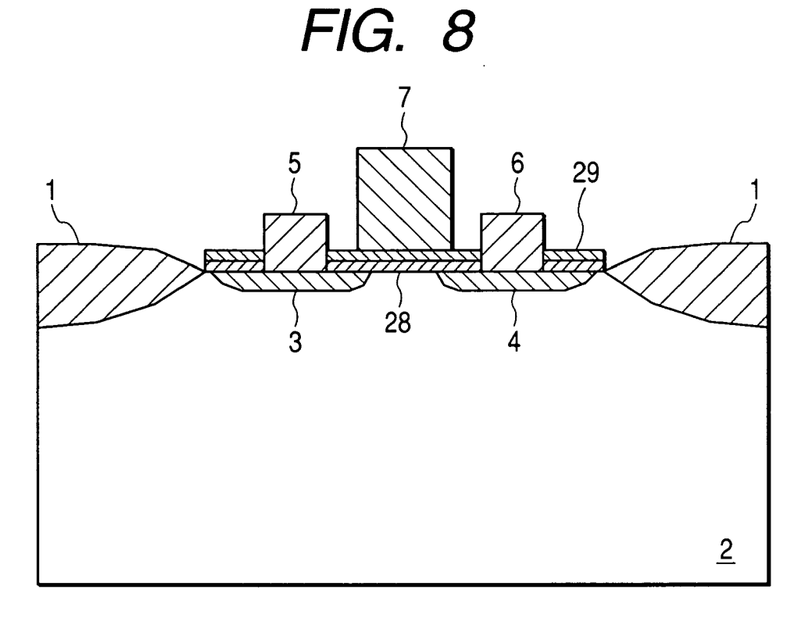
FIG. 8 is a view showing a sectional structure of a field effect transistor according to a third embodiment of the invention.

FIG. 8 shows a third embodiment according to the invention. Similar to Embodiment 1, after forming the active layer of the transistor, a silicon nitride film having a film thickness of about 0.8 nm is formed on the active layer by a procedure the same as that of Embodiment 1. Thereafter, Al is formed by 3 nm by an evaporation method and Al is subjected to an oxidizing heat treatment at 650° C. for 30 minutes in an oxygen atmosphere to thereby constitute a multilayered structure film of an amorphous $Al_2O_3$ thin film 29 and a silicon oxi-nitride film 28. Thereafter, a field effect transistor is produced by steps the same as those of Embodiment 1.

Embodiment 4

Figure 9:
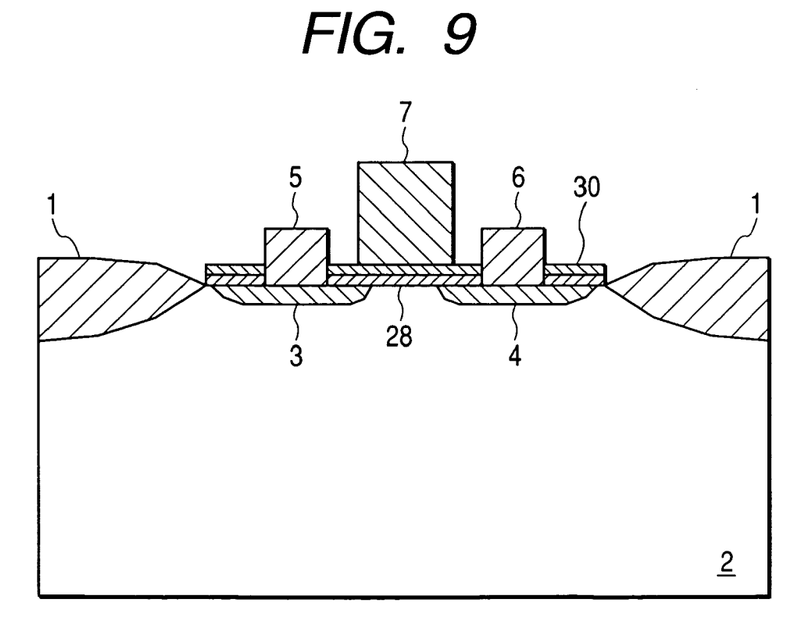
FIG. 9 is a view showing a sectional structure of a field effect transistor according to a fourth embodiment of the invention.

FIG. 9 shows a fourth embodiment according to the invention. Similar to Embodiment 1, after forming the active layer of the transistor, a silicon nitride film having a film thickness of about 1.8 nm is formed on the active layer by a procedure the same as that of Embodiment 1. Thereafter, Ti is formed by 5 nm by an evaporation method and Ti is subjected to an oxidizing heat treatment at 650° C. for 30 minutes in an oxygen atmosphere to thereby constitute a multilayered structure film of a titanium oxide ($TiO_2$) thin film 30 and a silicon oxi-nitride film 28. Thereafter, a field effect transistor is produced by steps the same as those of Embodiment 1.

Embodiment 5

Figure 10:
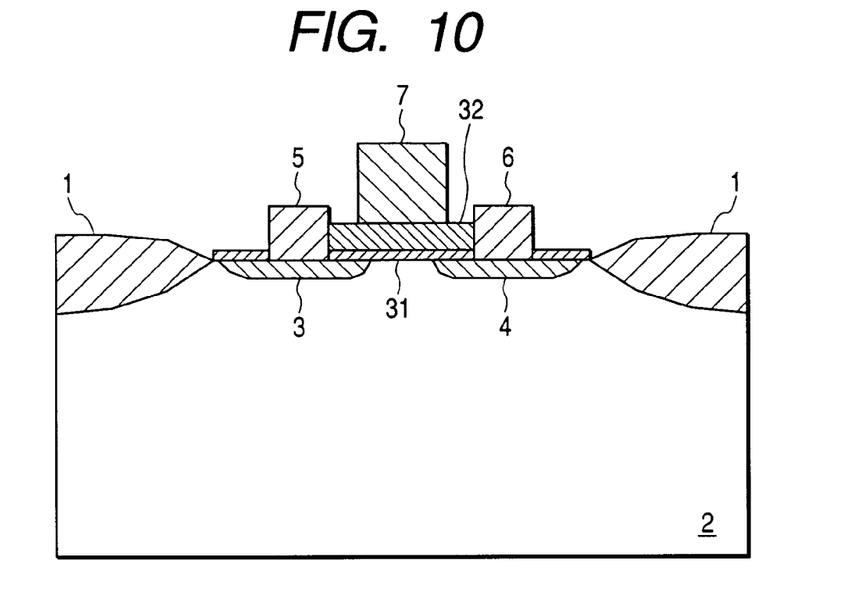
FIG. 10 is a view showing a sectional structure of a field effect transistor according to a fifth embodiment of the invention.

FIG. 10 shows a fifth embodiment according to the invention. Similar to Embodiment 1, after forming the active layer of the transistor, a silicon nitride film having a field thickness of about 1.8 nm is formed on the active layer by a procedure the same as that of Embodiment 1. Thereafter, a polycrystal $SrBi_2Ta_2O_9$ ferroelectric oxide film is formed by 120 nm by a sol-gel method to thereby constitute a multilayered structure film of a $SrBi_2Ta_2O_9$ ferroelectric thin film 32 and a silicon oxi-nitride film 31. Thereafter, a field effect transistor is produced by steps the same as those of Embodiment 1. Further, in order to crystallize the $SrBi_2Ta_2O_9$ ferroelectric thin film 32, the $SrBi_2Ta_2O_9$ ferroelectric thin film 32 is subjected to an oxidizing heat treatment at 750° C. for 30 minutes in an oxygen atmosphere.

Figure 11:
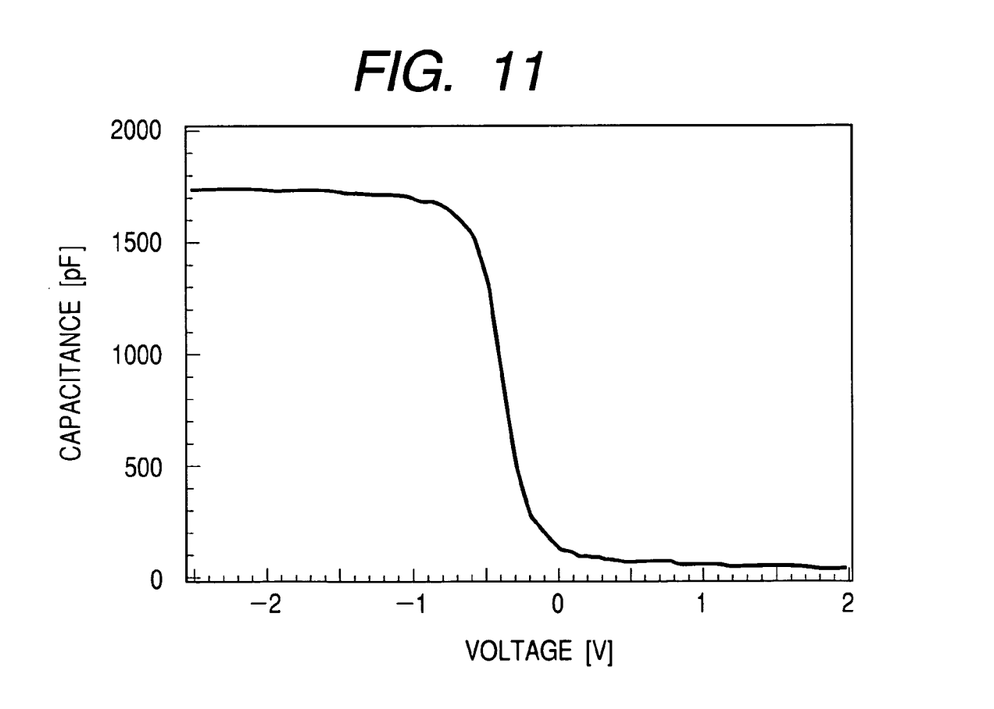
FIG. 11 is a diagram showing a gate capacitance characteristic of the field effect transistor according to the first embodiment.
Figure 12:
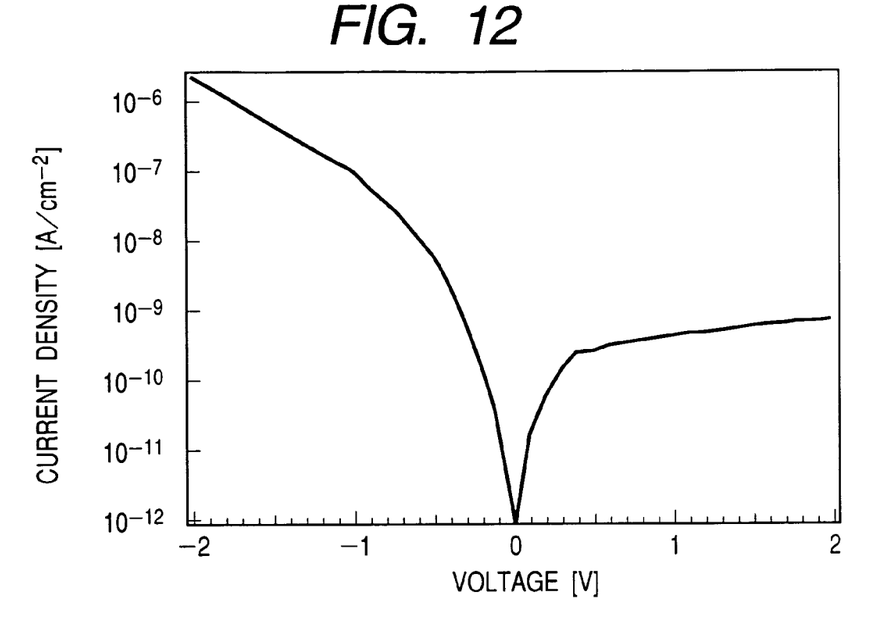
FIG. 12 is a diagram showing a gate current characteristic of the field effect transistor according to the first embodiment.

FIG. 11 shows a capacitance versus voltage characteristic measured between a gate electrode and a drain electrode of an MIS type field effect transistor produced by constituting a gate insulator by a silicon nitride film produced by the above-described method on a p-type silicon semiconductor. Further, FIG. 12 shows a current versus voltage characteristic measured by the same transistor.

The silicon nitride film is formed by dissociating the hydrogen termination, thereafter returning the substrate temperature to 30° C. and nitriding the substrate for 15 minutes and thereafter annealing the substrate at 900° C. for 60 minutes in pure nitrogen. Interface state density of the silicon substrate crystal and silicon nitride calculated by the Terman method from the capacitance characteristic of FIG. 11 is $3.5 \times 10^{11}$ cm$^{-2}$ eV$^{-1}$, and an extremely excellent characteristic is achieved, although the post heat treatment at a high temperature of 900° C. is carried out. This is a structure in which the silicon nitride film, produced by the above-described method according to the invention, does not include hydrogen and defects, showing that chemical bond of hydrogen and silicon which is to be dissociated at a temperature of 550° C. or higher does not exist in the film, and there is not brought about a phenomenon of reactivating traps which have been inactivated by the chemical bond of hydrogen and silicon by the post heat treatment and, therefore, the excellent characteristic is maintained regardless of the heat treatment at high temperature. Therefore, according to the field effect transistor of the invention, there can freely be adopted a step of producing a capacitor having a high dielectric constant, a characteristic of which remains unchanged at any post step of high temperature of LSI in an oxygen atmosphere at high temperature. Further, although the specific inductive capacity of silicon nitride is larger than that of silicon oxide, the band gap is small and leakage current in the thin film formation thereof can be reduced by combining with a silicon oxide film. Therefore, a laminated structure of a silicon oxide film and a silicon nitride film is advantageous as a gate insulator as shown by Embodiment 2 at an extremity of thinning the gate insulating film. When the present invention is used, the multilayered structure film having high quality as shown by Embodiment 2 can easily be realized since the film is provided with a high resistance against heat treatment in an oxidizing atmosphere. Further, by making full use of the high oxidation resistance, for example, the multilayered structure of the oxide thin film having the high dielectric constant and the silicon oxi-nitride film as shown by Embodiment 3 and Embodiment 4, or the multilayered structure of the oxide polycrystal thin film having high permittivity and silicon oxi-nitride shown by Embodiment 5, can be produced for the gate insulator.

Figure 13:
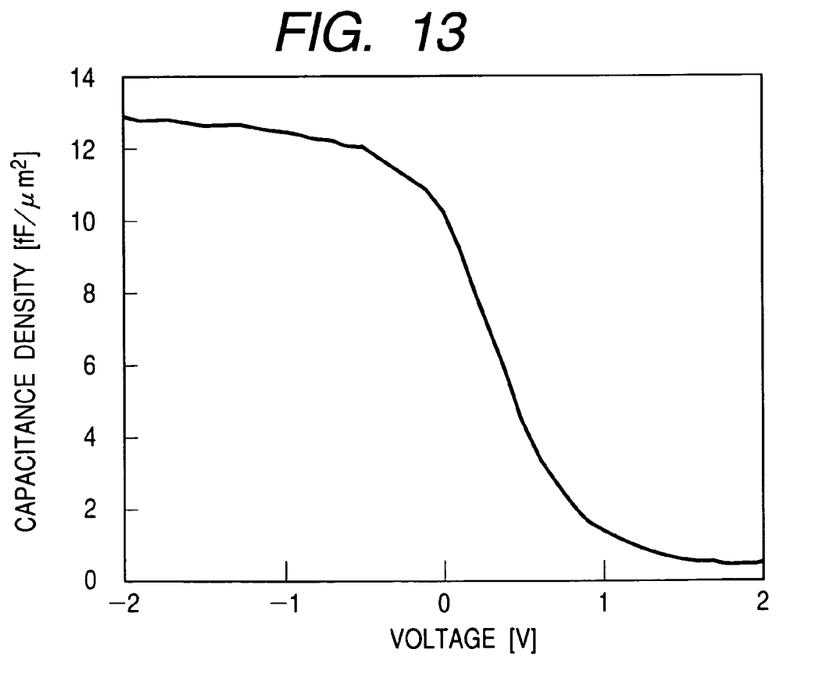
FIG. 13 is a diagram showing a gate capacitance characteristic of the field effect transistor according to the third embodiment.
Figure 14:
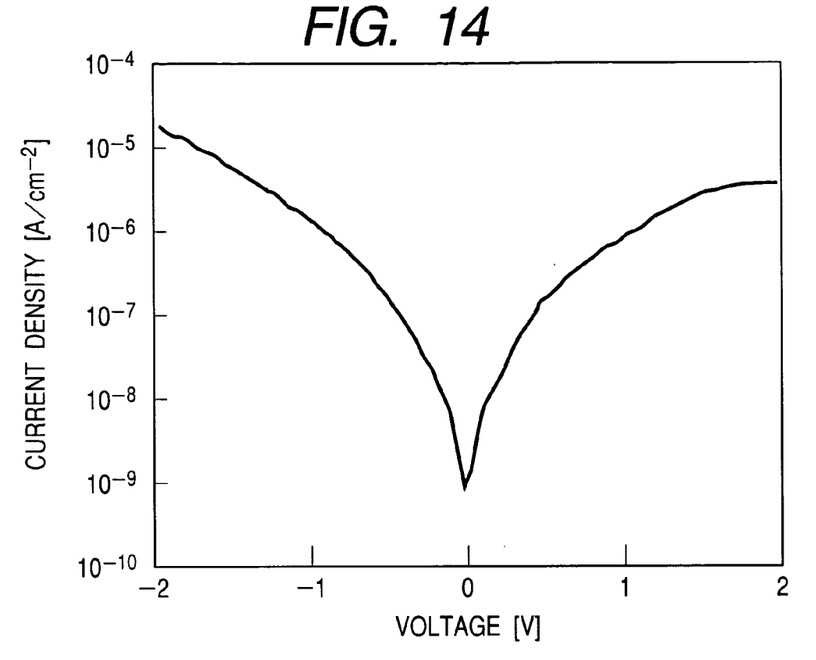
FIG. 14 is a diagram showing a gate current characteristic of the field effect transistor according to the third embodiment.

FIG. 13 shows a capacitance versus voltage characteristic measured between a gate electrode and a drain electrode of a MIS type field effect transistor constituting a gate insulator by the $Al_2O_3/Si_3N_4$ laminated insulator produced by Embodiment 3. Further, FIG. 14 shows a current versus voltage characteristic measured between the gate electrode and the drain electrode of the same MIS type field effect transistor. An effective thickness of an oxide film (a thickness of an $SiO_2$ film necessary for realizing the same capacitance density by the MIS structure), calculated from a maximum capacitance value on an accumulated side of FIG. 13, has been 2.66 nm.

Figure 15:
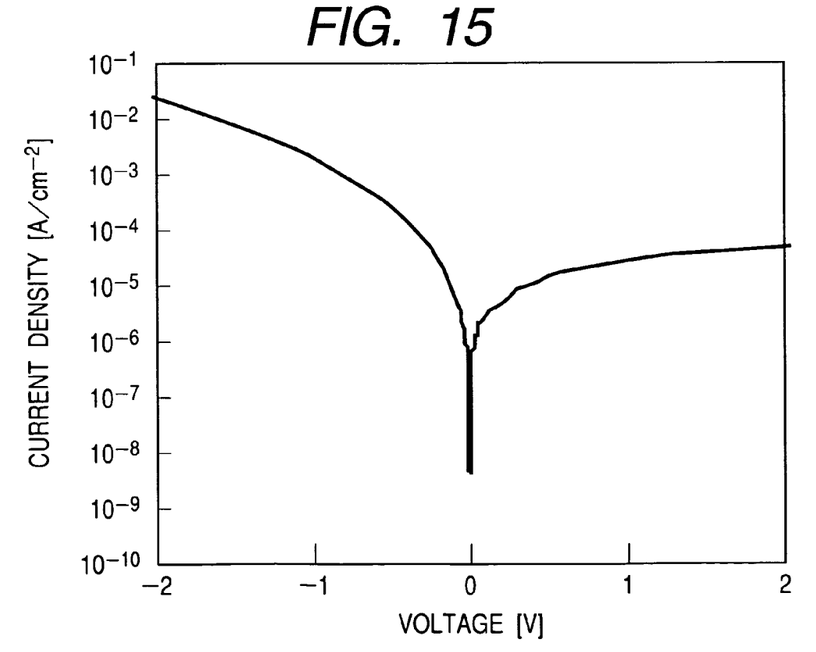
FIG. 15 is a diagram showing a gate current characteristic of a field effect transistor constituting a gate insulator by a silicon nitride film the same as that of the first embodiment.

FIG. 15 shows a current versus voltage characteristic measured between a gate electrode and a drain electrode of a MIS type field effect transistor constituting a gate insulator by a film of a single layer of $Si_3N_4$ having substantially the same effective thickness (2.67 nm) of an oxide film for comparison.

As is apparent by comparing FIG. 14 and FIG. 15, an element of the $Al_2O_3/Si_3N_4$ multilayered structure, shows an insulation characteristic more excellent than that of an element of the film of the single layer of $Si_3N_4$. This is because $Al_2O_3$ is provided with a band width larger than that of $Si_3N_4$ and is provided with high insulating performance to thereby show effectiveness of the laminated layer structure.

Meanwhile, according to the conventional laminated layer structure of the silicon nitride film and $Al_2O_3$, the silicon nitride film is deteriorated in the heat treatment of forming $Al_2O_3$ and the excellent capacitance characteristic as shown by FIG. 13 is not shown. Further, according to the single layer structure of $Al_2O_3$, a silicon single crystal of the substrate is oxidized in forming $Al_2O_3$ to thereby form a low dielectric constant layer and, therefore, it is difficult to realize a capacitance density higher than that of an element having the structure shown in Embodiment 3. By using the structure of Embodiment 3, while maintaining an excellent interface characteristic on the silicon single crystal of the substrate, high capacitance density and insulating performance, which have not been achieved conventionally, can be realized.

Although according to the embodiment, $Al_2O_3$ is used as the oxide thin film having the high dielectric constant, the invention achieves a similar effect even by using other oxide thin film having a high electric constant. Further, although $SrBi_2Ta_2O_9$ is used as the thin film having high permittivity, even when other thin film having high permittivity is used, the invention naturally achieves a similar effect.

Although according to the embodiment, there is shown an example of the n-channel field effect transistor provided at the p-type silicon single crystal, similar effect is naturally achieved also with regard to a p-channel transistor. Further, the active layer needs not to be the silicon single crystal and the invention achieves a similar effect even with regard to a field effect transistor produced at polycrystal silicon. Further, although according to embodiments of the invention, there is shown the example of using the silicon nitride film in contact with the silicon substrate crystal, in consideration of a thermally stable property, it is not necessarily needed to provide the silicon nitride film in contact with the active layer as one of the gate insulators of the multilayered structure but, for example, a structure of providing the silicon nitride film in contact with the active layer and providing the silicon nitride film thereon, is also effective.

Further, the invention is not limited to the field effect transistor used in the above-described embodiments but the invention is effective also with regard to a flash memory type field effect transistor having at least one floating gate between a gate electrode and a semiconductor active layer.

As described above, the invention realizes the semiconductor device thermally stable in the post process and suitable for producing the gate insulator having the laminated structure with various high dielectric constant oxides and the process of producing the same and its effect provided to the semiconductor production field is enormous.

What is claimed is:

1. A process for producing a semiconductor device, comprising:
   a step of forming a gate insulator on a silicon substrate; and
   a step of forming a gate electrode, a source electrode and a drain electrode on the silicon substrate,
   wherein said step of forming the gate insulator includes
   a first step of forming a silicon nitride film on the surface of the silicon substrate by irradiating to the silicon substrate nitrogen radicals generated from a radical nitriding apparatus, the radical nitriding apparatus being provided with a plasma chamber for generating nitrogen plasma including the nitrogen radicals, a substrate susceptor, provided outside of the plasma chamber, for supporting the silicon substrate, and ion deflecting means provided between the plasma chamber and the substrate susceptor, and wherein,
   in said step of forming a silicon nitride film, more atomic nitrogen radicals are generated than $N_2$ radicals in the plasma chamber.

2. A process for producing a semiconductor device, comprising:
   a step of forming a gate insulator on a silicon substrate; and
   a step of forming a gate electrode, a source electrode and a drain electrode on the silicon substrate,
   wherein said step of forming the gate insulator includes
   a first step of forming a silicon nitride film on the surface of the silicon substrate by irradiating to the silicon substrate nitrogen radicals generated from a radical nitriding apparatus, the radical nitriding apparatus being provided with a plasma chamber for generating nitrogen plasma including the nitrogen radicals, a substrate susceptor, provided outside of the plasma chamber, for supporting the silicon substrate, and ion deflecting means provided between the plasma chamber and the substrate susceptor, wherein said ion deflecting means are ion deflecting electrodes.

3. The process according to claim 2, wherein, in said step of forming a silicon nitride film, more atomic nitrogen radicals are generated than $N_2$ radicals in the plasma chamber.

4. The process according to claim 1, wherein said step of forming a gate insulator on a silicon substrate further includes a step of forming a silicon oxi-nitride film, by oxidizing said silicon nitride film after said step of forming a silicon nitride film.

5. The process according to claim 2, wherein said step of forming the gate insulator on a silicon substrate further includes a step of forming a silicon oxi-nitride film, by oxidizing the silicon nitride film after said step of forming a silicon nitride film.

6. The process according to claim 1, wherein said step of forming the gate insulator on a silicon substrate further includes a step of forming a silicon oxi-nitride film, by oxidizing the silicon nitride film after said step of forming a silicon nitride film.

7. The process according to claim 3, wherein said step of forming the gate insulator on a silicon substrate further includes a step of forming a silicon oxi-nitride film, by oxidizing the silicon nitride film after said step of forming a silicon nitride film.

8. The process according to claim 1, wherein said step of forming the gate insulator on a silicon substrate further includes a second step of forming a metal film on the silicon nitride film, and a step of forming a silicon oxi-nitride film and a metal oxide film by oxidizing the silicon nitride film and the metal film, after said step of forming a silicon nitride film.

9. The process according to claim 2, wherein said step of forming the gate insulator on a silicon substrate further includes a second step of forming a metal film on the silicon nitride film, and a step of forming a silicon oxi-nitride film and a metal oxide film by oxidizing the silicon nitride film and the metal film, after said step of forming a silicon nitride film.

10. The process according to claim 1, wherein said step of forming the gate insulator on a silicon substrate further includes a second step of forming a metal film on the silicon nitride film, and a step of forming a silicon oxi-nitride film and a metal oxide film by oxidizing the silicon nitride film and the metal film, after said step of forming a silicon nitride film.

11. The process according to claim 4, wherein said step of forming the gate insulator on a silicon substrate further includes a second step of forming a metal film on the silicon nitride film, and a step of forming a silicon oxi-nitride film and a metal oxide film by oxidizing the silicon nitride film and the metal film, after said step of forming a silicon nitride film.

12. The process according to claim 1, wherein said step of forming the gate insulator on a silicon substrate further includes a step of forming a ferroelectric film on the silicon nitride film after said step of forming a silicon nitride film.

13. The process according to claim 2, wherein said step of forming the gate insulator on a silicon substrate further includes a step of forming a ferroelectric film on the silicon nitride film after said step of forming a silicon nitride film.

14. The process according to claim 1, wherein said step of forming the gate insulator on a silicon substrate further includes a step of forming a ferroelectric film on the silicon nitride film after said step of forming a silicon nitride film.

15. The process according to claim 4, wherein said step of forming the gate insulator on a silicon substrate further includes a step of forming a ferroelectric film on the silicon nitride film after said step of forming a silicon nitride film.

16. The process according to claim 1,
wherein the radical nitriding apparatus is further provided with a Radio Frequency (RF) induction coil installed surrounding the plasma chamber, and
wherein, in said step of forming a silicon nitride film, Radio Frequency (RF) is applied from an outside power source to the Radio Frequency (RF) induction coil.

17. A process according to claim 16,
wherein the radical nitriding apparatus is further provided with a vacuum vessel communicating with one side of the plasma chamber via openings,
wherein the substrate suseptor is installed in the vacuum vessel,
wherein, in said step of forming a silicon nitride film, nitrogen radicals are introduced into the vacuum vessel by a pressure difference between the plasma chamber and the vacuum vessel, and wherein, in said step of forming a silicon nitride film, ions leaked from the plasma chamber are deflected and restrained from reaching the silicon substrate by the ion deflecting means.

* * * * *